United States Patent
Yamada

(10) Patent No.: US 9,530,713 B2
(45) Date of Patent: Dec. 27, 2016

(54) COOLER-INTEGRATED SEMICONDUCTOR MODULE

(71) Applicant: FUJI ELECTRIC CO., LTD., Kawasaki-shi (JP)

(72) Inventor: Takafumi Yamada, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/205,723

(22) Filed: Jul. 8, 2016

(65) Prior Publication Data
US 2016/0322275 A1    Nov. 3, 2016

Related U.S. Application Data

(63) Continuation of application No. PCT/JP2015/063442, filed on May 11, 2015.

(30) Foreign Application Priority Data

Jun. 23, 2014  (JP) .................................. 2014-128333

(51) Int. Cl.
*H01L 23/48* (2006.01)
*H01L 23/367* (2006.01)
(Continued)

(52) U.S. Cl.
CPC ....... *H01L 23/3672* (2013.01); *H01L 23/3114* (2013.01); *H01L 24/83* (2013.01); *H01L 2224/83801* (2013.01); *H01L 2924/014* (2013.01); *H01L 2924/0105* (2013.01); *H01L 2924/01047* (2013.01);
(Continued)

(58) Field of Classification Search
CPC ... H01L 23/3672; H01L 23/3114; H01L 24/83
See application file for complete search history.

(56) References Cited

U.S. PATENT DOCUMENTS

2004/0232534 A1    11/2004  Seki et al.
2006/0045413 A1*    3/2006  Weigert ............... G02B 6/4201
                                                               385/15
(Continued)

FOREIGN PATENT DOCUMENTS

JP      2004-349497 A    12/2004
JP      2007-184315 A     7/2007
(Continued)

OTHER PUBLICATIONS

PCT, "International Search Report for International Application No. PCT/JP2015/063442".

*Primary Examiner* — Nicholas Tobergte
(74) *Attorney, Agent, or Firm* — Manabu Kanesaka

(57) ABSTRACT

A cooler-integrated semiconductor module, includes an insulating substrate; a circuit layer disposed on a front surface of the insulating substrate; a semiconductor element electrically connected to the circuit layer; a metal layer provided on a back surface of the insulating substrate; a sealing resin covering the insulating substrate, the circuit layer, the semiconductor element, and a portion of the metal layer; a cooler disposed on a lower surface side of the metal layer; a plating layer disposed on at least a surface of the sealing resin facing the cooler; and a joining member connecting the plating layer and the cooler.

6 Claims, 3 Drawing Sheets

(51) Int. Cl.
    *H01L 23/31*     (2006.01)
    *H01L 23/00*     (2006.01)

(52) U.S. Cl.
    CPC ............ *H01L 2924/01051* (2013.01); *H01L 2924/1203* (2013.01); *H01L 2924/13055* (2013.01); *H01L 2924/13091* (2013.01); *H01L 2924/3511* (2013.01); *H01L 2924/3512* (2013.01)

(56) References Cited

U.S. PATENT DOCUMENTS

| | | | |
|---|---|---|---|
| 2007/0246833 A1 | 10/2007 | Soga et al. | |
| 2008/0284007 A1 | 11/2008 | Horio et al. | |
| 2012/0181679 A1 | 7/2012 | Kadoguchi et al. | |
| 2014/0196871 A1* | 7/2014 | Otsuka | H05K 7/20236 165/104.33 |
| 2014/0291833 A1* | 10/2014 | Sato | H01L 23/3672 257/719 |
| 2014/0332951 A1 | 11/2014 | Nakamura et al. | |
| 2016/0190033 A1* | 6/2016 | Morozumi | H01L 24/34 257/712 |

FOREIGN PATENT DOCUMENTS

| | | |
|---|---|---|
| JP | 2007-329362 A | 12/2007 |
| JP | 2008-288414 A | 11/2008 |
| JP | 2012-142465 A | 7/2012 |
| JP | 2012-146919 A | 8/2012 |
| WO | 2013/118478 A1 | 8/2013 |

\* cited by examiner

COOLER-INTEGRATED SEMICONDUCTOR MODULE

CROSS-REFERENCE TO RELATED APPLICATION

This is a continuation application of PCT International Application No. PCT/JP2015/063442 filed on May 11, 2015, which claims a priority of Japanese Patent Application No. 2014-128333 filed on Jun. 23, 2014.

TECHNICAL FIELD

The present invention relates to a power semiconductor module used in a power conversion device that controls a large current and a high voltage, or the like.

BACKGROUND ART

Devices using a motor typically for a hybrid vehicle, electric vehicle, or the like requires a power conversion device with excellent energy conservation. A power semiconductor module mounted with a power semiconductor element such as an IGBT (Insulated Gate Bipolar Transistor) is widely used in this power conversion device. In order to efficiently radiate heat generated when the power semiconductor element is energized with a large current, the power semiconductor module is required to be connected to a cooler, to be small, and to be structured to have excellent heat radiation performance.

For example, a semiconductor module disclosed in PTL 1 includes an insulated circuit substrate wherein a metal layer is disposed on either surface of a ceramic substrate. A multiple of power semiconductor elements is joined to one main surface of the insulated circuit substrate, while a thick heat radiating substrate made of metal is joined to the other main surface. The insulated circuit substrate is housed in a resin case, and a gel-form resin is injected, thereby forming a power semiconductor module. Further, the semiconductor module is fixed with a bolt and nut to a cooler through a heat radiating grease.

Meanwhile, a semiconductor module wherein, after a resin sealed module and a cooler are joined with solder, a gap in a region peripheral to the solder joint portion is filled with a sealing resin is disclosed in PTL 2.

Also, a semiconductor module including a metal block, a semiconductor element joined through a solder layer onto the metal block, and a resin molded portion in which the metal block and the semiconductor element are molded, wherein the metal block has a surface including a plated region and a roughened region, and the semiconductor element is mounted in the plated region, is disclosed in PTL 3.

CITATION LIST

Patent Literature
PTL 1: JP-A-2008-288414
PTL 2: JP-A-2012-142465
PTL 3: JP-A-2012-146919

SUMMARY OF INVENTION

Technical Problem

However, the semiconductor module described in PTL 2 has a problem in that there is an additional process of filling the gap between the lower surface of the sealing resin enclosing the solder joint portion and the cooler with resin, and a problem in that reliably filling the gap with resin is not easy when a multiple of semiconductor modules is joined to the cooler.

Meanwhile, the semiconductor module described in PTL 3 has a structure such that, because the metal block formed with the plated region and the roughened region is interposed between the semiconductor element and a cooling plate, a sealing resin is directly contacting the semiconductor element, metal block, solder, and cooling plate, and not only is the structure far from compact, but there is also a problem in that the adhesion has to be secured at various interfaces.

Therefore, taking the previously described problems into consideration, an object of the present invention is to provide a cooler-integrated semiconductor module of a compact structure with excellent heat radiation performance, which has a highly reliable solder joint with a cooler, and is economical.

Solution to Problem

In order to resolve the heretofore described problems, thereby achieving the object, a cooler-integrated semiconductor module of the present invention includes an insulating substrate, a circuit layer provided on a front surface of the insulating substrate, a semiconductor element electrically connected to the circuit layer, a metal layer provided on a back surface of the insulating substrate, a sealing resin that covers the insulating substrate, the circuit layer, the semiconductor element, and a portion of the metal layer, a cooler disposed on a lower surface side of the metal layer, a plating layer disposed on at least a surface of the sealing resin facing the cooler, and a joining member that connects the plating layer and the cooler.

In one aspect of the cooler-integrated semiconductor module of the present invention, a roughness of an interface of the sealing resin with the plating layer is preferably an arithmetic mean roughness of 5 µm or more.

In one aspect of the cooler-integrated semiconductor module of the present invention, at least the surface of the sealing resin facing the cooler is preferably a surface roughened using any method selected from a chemical etching, a mechanical grinding, a sandblasting method, or a laser processing, or a surface molded by a rough surface formed in advance in a transfer molding die.

In one aspect of the cooler-integrated semiconductor module of the present invention, a thickness of the joining member is preferably 250 µm or less.

In one aspect of the cooler-integrated semiconductor module of the present invention, the joining member is preferably a solder with a composition of 89% Sn8% Sb3% Ag.

In one aspect of the cooler-integrated semiconductor module of the present invention, the plating layer is preferably of a thickness of 1 µm or more and 5 µm or less, and includes at least one type of metal selected from copper, nickel, gold, and silver.

Advantageous Effects of Invention

According to the present invention, a cooler-integrated semiconductor module of a compact structure with excellent heat radiation performance, which has a highly reliable solder joint with a cooler and is economical, can be provided.

DESCRIPTION OF EMBODIMENTS

Hereafter, while referring to the figures of the present application, a description will be given of one embodiment of a cooler-integrated semiconductor module according to the present invention. In the following description of the one embodiment and in figures of the present application, the same reference signs are allotted to identical configurations, and redundant descriptions are omitted. Also, to facilitate viewing or to facilitate understanding, the figures of the present application are not drawn to an accurate scale or dimensional ratio. Provided that the scope of the present invention is not exceeded, the present invention is not limited to the details of the one embodiment described hereafter.

Figure 1:
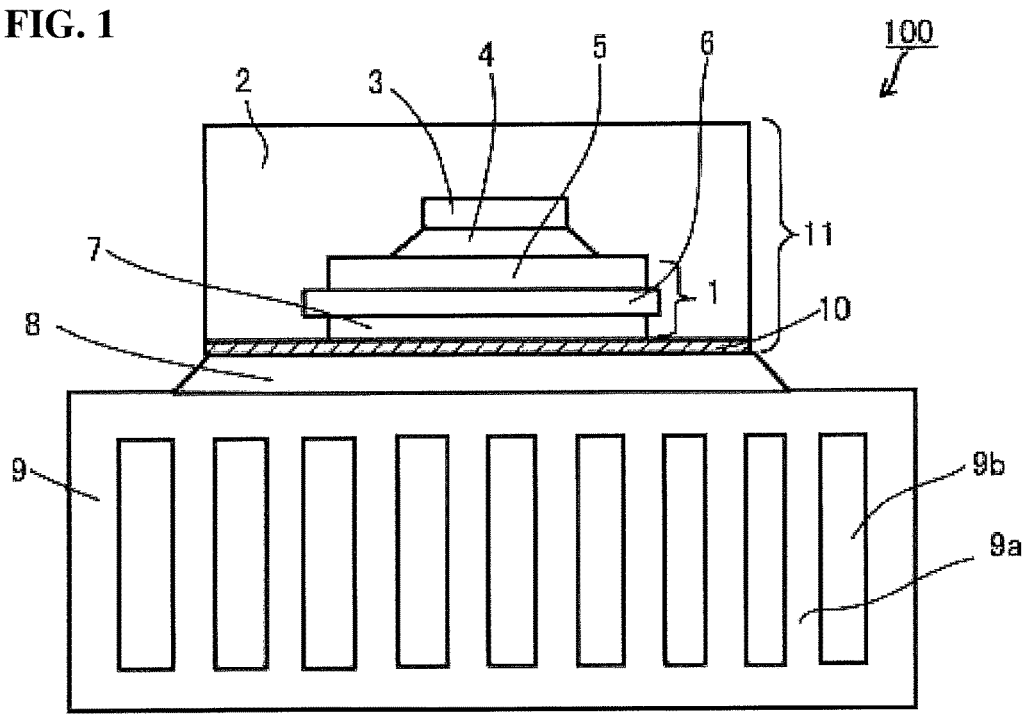
FIG. 1 is a cross sectional view representing one embodiment of a cooler-integrated semiconductor module.

In FIG. 1, the one embodiment of a cooler-integrated semiconductor module according to the present invention is shown as a cross sectional view. A cooler-integrated semiconductor module 100 includes a semiconductor module 11 having an insulated wiring substrate 1 and a semiconductor element 3, and a cooler 9 thermally connected to the semiconductor module 11. The insulated wiring substrate 1 has an insulating substrate 6, a circuit layer 5 disposed on one main surface of the insulating substrate 6, and a metal layer 7 disposed on the other main surface, wherein the semiconductor element 3 is joined through a solder layer 4 to the circuit layer 5, and a sealing resin 2 covers the entirety. A plating layer 10 is provided on the surface of the semiconductor module 11 facing the cooler 9.

The type of the semiconductor element 3 is not particularly limited. For example, the semiconductor element 3 may be an IGBT, power MOSFET (Metal Oxide Semiconductor Field Effect Transistor), or FWD (Free Wheeling Diode), or may be an RB-IGBT (Reverse Blocking-Insulated Gate Bipolar Transistor) or RC-IGBT (Reverse Conducting-Insulated Gate Bipolar Transistor) wherein the above are formed in one semiconductor element.

One end portion of circuit wiring (not shown) formed of a metal with good electrical conductivity such as copper or an aluminum alloy and formed as pin wiring, wire wiring, lead frame wiring, or the like, is conductively connected to an electrode film (not shown) on the upper surface of the semiconductor element 3. Also, the other end portion of the circuit wiring (not shown) is connected to an external connection terminal (not shown) led out to the exterior from the sealing resin 2. An electrode film (not shown) on the lower surface of the semiconductor element 3 is well connected thermally and electrically to a required position on the circuit layer 5 through the solder layer 4. The circuit layer 5 is formed such that a metal foil or the like with good electrical conductivity, made of copper or the like, is joined in advance to the upper surface of an insulating substrate, such as a ceramic substrate with insulating properties. An SnSb series or SnSbAg series lead free solder, or the like, is used as the type of solder in the solder layer 4. However, it is preferable that the melting point of the solder in the solder layer 4 is higher than the melting point of solder in a solder layer 8, to be described hereafter, so that the solder layer 4 does not melt again when forming the solder layer 8. Each of the circuit layer 5 and the metal layer 7 joined in advance to the back surface side of the insulating substrate 6 is disposed inward of the outer peripheral edge of the insulating substrate 6 so as to have a predetermined creepage distance such that the two layers are reliably electrically isolated. It is preferable that the metal layer 7 is formed of a metal with good electrical conductivity, such as copper.

The cooler 9 includes in the interior thereof a refrigerant path 9b compartmentalized by a multiple of fins 9a. The cooler 9 is directly joined through the solder layer 8 to the metal layer 7 on the lower surface side of the insulating substrate 6. Compared to a joint structure of the conventional art wherein a thick heat radiating substrate or a heat radiating grease with poor thermal conductivity is interposed between the back surface of a semiconductor module and a cooler, the joint structure according to the one embodiment has a compact size with low heat resistance, and cooling efficiency (heat radiation performance) can be improved.

Although only one semiconductor element 3 is mounted in the cross sectional view of the cooler-integrated semiconductor module 100 shown in FIG. 1, the rated output can be increased by a multiple of semiconductor elements being connected in parallel, as in a 2-in-1 module or the like. For example, a 6-in-1 semiconductor module configuration wherein three heat radiation substrateless resin sealed module units (hereafter, simply units) of 2-in-1 structure are joined with solder to the upper surface of the cooler, or a unit assembly structure module configuration wherein six resin sealed units of 1-in-1 structure are aligned, may be adopted. With a heat radiation substrateless structure module having a configuration wherein finely divided units are assembled in this way, stress is reduced by reducing the resin volume, so that cracking of the sealing resin can be restricted. Also, since the strength of the joint between the semiconductor module 11 and the cooler 9 is maintained by the plating layer 10, even when the number of semiconductor elements is increased, cracking, detachment, and the like, due to thermal stress (warping stress) caused by a difference in thermal expansion coefficient can be prevented.

Also, each type of the multiple of semiconductor elements 3 may be replaced with a different type of semiconductor element. For example, a structure may be adopted wherein an IGBT and FWD are aligned and connected with solder, and the wires are connected to be in an anti-parallel connection.

Furthermore, in FIG. 1, a metal block (not shown) of copper, or the like, with good thermal conductivity may be inserted, and joined with solder to the upper surface of the circuit layer 5 or the lower surface of the metal layer 7. By this metal block being inserted, heat generated in the semiconductor element 3 can immediately be spread to the metal block, which has high thermal capacity and a heat resistance lower than that of solder, so that heat resistance can be further reduced. In addition, a structure wherein a metal block is installed below the metal layer 7 is preferable as thermal stress (warping stress) generated when joining with solder to the cooler 9 can be restricted, so that an adverse effect on the thin insulating substrate 6 can also be reduced. The adverse effect can be reduced because the thermal stress caused by a difference in thermal expansion coefficient between the insulating substrate 6 and the cooler 9 is restricted by the metal block sandwiched therebetween.

The sealing resin 2 covering the semiconductor module 11 is formed so that the back surface of the metal layer 7 is exposed. The material of the sealing resin 2, not being particularly limited, may be a material having a predetermined insulation performance and a good moldability. For example, epoxy resin or the like is preferably used.

The plating layer 10 is formed on the metal layer 7 exposed at the lower surface of the semiconductor module 11, and on the lower surface of the sealing resin 2 on the periphery of the metal layer 7. When the plating layer 10 is provided over the entire lower surface of the semiconductor module 11, the previously described warping caused by a difference in thermal expansion coefficient occurring after joining with solder can be restricted.

Not being particularly limited, a single layer film of a metal such as copper, nickel, gold, or silver, a stacked film including the above-mentioned metal films, or an alloy film including at least one kind of metal from among the above-mentioned metals, can be preferably used as the plating layer 10. Also, the thickness of the plating layer 10 is preferably within a range of 1 μm or more to 5 μm or less. As a thickness of the plating layer 10 of less than 1 μm is too thin, the plating layer 10 is eaten up by the solder and disappears when joining to the cooler 9 with the solder. The function of restricting the warping becomes weaker, and a problem of solder cracking or solder division occurs. Meanwhile, a thickness exceeding 5 μm leads to an increase in cost.

It is particularly desirable that the lower surface of the sealing resin 2 with which the plating layer 10 is covered is roughened, as the adhesion of the plating layer 10 to the sealing resin 2 improves. A method such as chemical etching, mechanical grinding, sandblasting, laser processing, or roughening a surface of the molding die can be used as a method of roughening the lower surface of the resin. In particular, it is preferable when the degree of roughening is 5 μm or more at an arithmetic mean roughness specified by JIS standard B0601, as the adhesive strength of the plating layer 10 increases. As opposed to this, when the surface roughness is less than 5 μm, the adhesive strength is low, and the plating layer is liable to become detached from the lower surface of the resin. For example, when the plating layer 10 becomes detached from the lower surface of the sealing resin when joining with solder, or after a subsequent heat cycle, warping occurs in the insulated wiring substrate due to thermal stress, which is undesirable. When the adhesive strength between the plating layer 10 and sealing resin 2 is increased by roughening the lower surface of the sealing resin 2 before forming the plating layer 10, warping can be prevented by preventing detachment of the plating layer 10.

The plating layer 10 formed on the lower surface of the semiconductor module 11 is joined through the solder layer 8 to the cooler 9. As the step of joining the semiconductor module 11 and the cooler 9 is subsequent to the resin sealing step in the semiconductor module 11 manufacturing process, a problem occurs in that the semiconductor element 3 breaks due to contraction stress in the sealing resin 2 if the soldering temperature is high when the semiconductor module 11 and the cooler 9 are joined. Therefore, it is desirable that the solder layer 8 is formed from an SnSbAg series, which has a low melting point and high strength. In particular, the plating layer 10 covers the entire lower surface of the sealing resin 2, and the entire lower surface of the semiconductor module 11 is joined with solder to the cooler 9. As a result of this, even when a crack forms in the solder in the step of joining with solder, the allowable length of a solder crack starting from an end portion of the solder layer can be increased because the solder joint area is large, and an increase in reliability can be expected. Also, as the entire lower surface of the sealing resin of the semiconductor module 11 can be fixed to the cooler, deformation of the semiconductor module 11 in a temperature cycle is restricted, increasing reliability of the solder layer 8 (for example, restriction of cracking), so that a defect such as resin division can be prevented.

As heretofore described, according to the one embodiment of the present invention, reliability of the cooler-integrated semiconductor module 100 can be increased.

Figure 2:
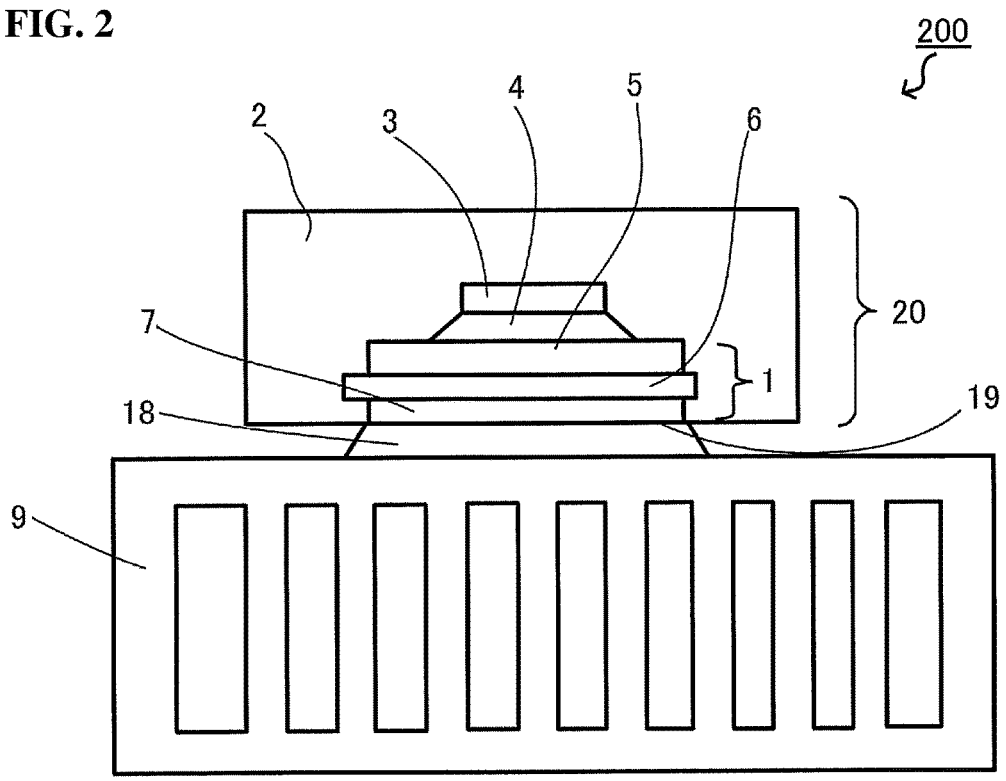
FIG. 2 is a cross sectional view showing a comparison example of the cooler-integrated semiconductor module.

When the one embodiment according to the present invention is not employed, it is supposed that the following kinds of problem occur. A cooler-integrated semiconductor module 200 shown in FIG. 2 is formed such that there is a gap between the sealing resin 2 on the periphery of a solder layer 18 and the cooler 9. As there is a difference in the linear thermal expansion coefficient between the insulated wiring substrate 1 and the cooler 9, the effect of thermal stress caused by the difference is liable to appear in the insulated wiring substrate 1, which is thin and has low mechanical strength. As a result of this, deformation is liable to occur in the insulated wiring substrate 1, and there is a concern that reliability of the solder layer 18 will become a problem. Also, when sealing a semiconductor module 20 of a heat radiation substrateless structure with resin using insert molding, the resin volume increases too much, and cracking is liable to occur in the resin, when the number of power semiconductor elements 3 mounted inside the module 20 increases.

Embodiment

Hereafter, a description will be given of the one embodiment wherein reliability according to a cooler-integrated semiconductor module temperature cycle (−40° C. to 105° C.) is predicted using a thermal stress simulation.

Embodiment

A cross-section of the cooler-integrated semiconductor module 100 used in the calculation of the one embodiment is shown in FIG. 1. The insulated wiring substrate 1 of the semiconductor module 11 includes the ceramic insulating substrate 6, which has a thickness of 0.32 mm and has silicon nitride as a main component, the circuit layer 5, which is formed of a copper alloy of 0.4 mm thickness disposed on one main surface of the insulating substrate 6, and the metal layer 7, which is formed of a copper alloy of 0.4 mm thickness disposed on the other main surface of the insulating substrate 6. The semiconductor element 3, of a one IGBT structure, is joined to the top of the circuit layer 5 by the solder layer 4, which is of an SnSb series. The sealing resin 2 covering the insulated wiring substrate 1 and the semiconductor element 3 is formed using epoxy resin insert molding. Further, the nickel plating layer 10, which has a thickness of 5 μm, is disposed over the entire back surface of the semiconductor module 11. Meanwhile, the cooler 9 includes an outer shell of 1 mm thickness, formed using aluminum alloy (A6063) extrusion molding, and a fin of a thickness of 0.8 mm. The semiconductor module 11 is connected to the cooler 9 through the 89% Sn8% Sb3 % Ag solder layer 8, which has a thickness of 0.25 mm. The metal composition ratio is expressed as a percentage by mass. That is, the solder layer 8 includes 89% Sn, 8% Sb, and 3% Ag. However, each composition ratio may include a slight amount of impurity unavoidable in the solder production process.

Comparison Example

A cross-section of the cooler-integrated semiconductor module 200 used in calculation of a comparison example is shown in FIG. 2. As the nickel plating layer 10 is not formed on the back surface of the semiconductor module 20, there is a gap between the lower surface of the sealing resin 2 and the cooler 9 in a region peripheral to the solder layer 18. However, configurations other than this are the same as in the one embodiment.

Thermal Stress Simulation

Figure 3:
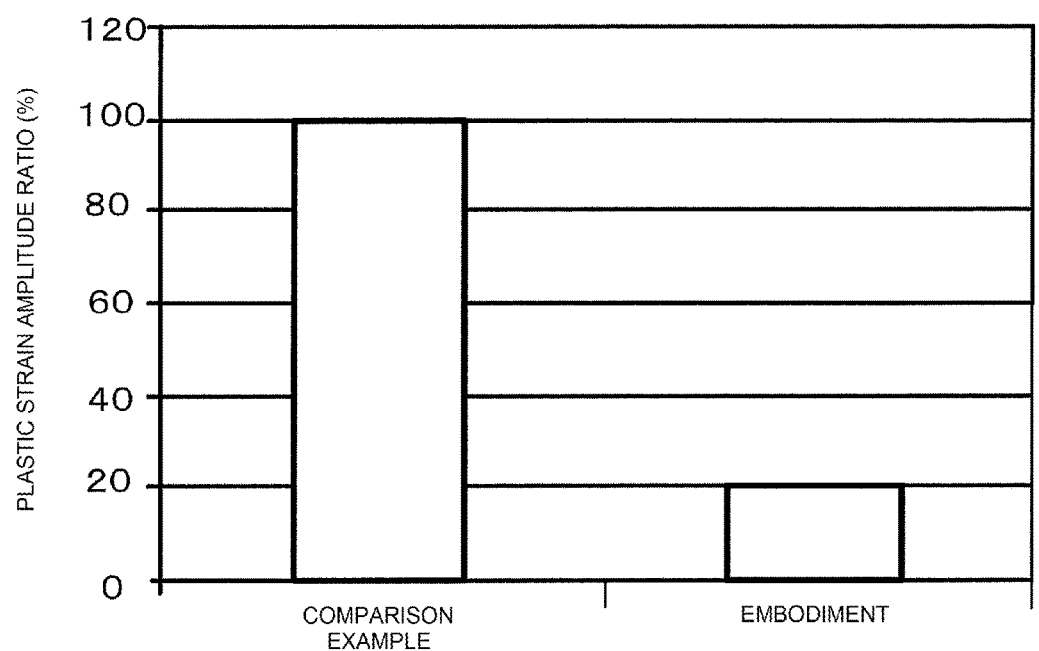
FIG. 3 is a comparison diagram of plastic strain amplitude ratios (%) of the one embodiment and the comparison example of the cooler-integrated semiconductor module.

In a thermal stress simulation, the plastic strain amplitude (%) generated in the solder layer 8 is calculated when the temperature of the entire semiconductor module is changed from −40° C. to 105° C., and the calculation results are shown in FIG. 3.

Generally, it is assumed that the low cycle fatigue lifespan of solder complies with the Manson-Coffin Law in Expression (1).

$$\Delta \epsilon p N f^b = C \qquad (1)$$

($\Delta \epsilon p$ is the plastic strain amplitude, Nf is the fatigue lifespan, and b and C are constants depending on the material)

According to FIG. 3, taking the plastic strain amplitude ratio of the comparison example to be 100%, the plastic strain amplitude ratio of the one embodiment of the cooler-integrated semiconductor module is 20%, meaning that the plastic strain amplitude ratio is reduced to one-fifth. Therefore, according to the Manson-Coffin Law, the one embodiment of the cooler-integrated semiconductor module, which has small plastic strain amplitude, has a longer lifespan.

According to the heretofore described embodiment according to the present invention, there is no heat radiating substrate of the conventional art required to fix the semiconductor module to the cooler using a bolt and nut, and furthermore, there is no need for heat radiating grease, because of which the external form is compact and heat radiation performance increases. When joining the semiconductor module directly to the cooler with solder, the solder joint portion spreads over the entire plating layer on the lower surface of the semiconductor module, because of which the non-defective rate of the solder joint portion increases, and reliability increases, in comparison with a semiconductor module of the conventional art that has no plating layer.

REFERENCE SIGNS LIST

1: Insulated wiring substrate
2: Sealing resin
3: Semiconductor element
4: Solder layer
5: Circuit layer
6: Insulating substrate, ceramic substrate
7: Metal layer
8, 18: Solder layer
9: Cooler, fin base
9a: Fin
9b: Refrigerant path
10: Plating layer
11, 20: Semiconductor module
100, 200: Cooler-integrated semiconductor module

What is claimed is:

1. A cooler-integrated semiconductor module, comprising:
    an insulating substrate;
    a circuit layer disposed on a front surface of the insulating substrate;
    a semiconductor element electrically connected to the circuit layer;
    a metal layer provided on a back surface of the insulating substrate;
    a sealing resin covering the insulating substrate, the circuit layer, the semiconductor element, and a portion of the metal layer;
    a cooler disposed on a lower surface side of the metal layer;
    a plating layer disposed on at least a surface of the sealing resin facing the cooler; and
    a joining member connecting the plating layer and the cooler.

2. The cooler-integrated semiconductor module according to claim 1, wherein a roughness of an interface of the sealing resin with the plating layer is an arithmetic mean roughness of 5 μm or more.

3. The cooler-integrated semiconductor module according to claim 2, wherein at least the surface of the sealing resin facing the cooler is a surface roughened by a chemical etching, a mechanical grinding, a sandblasting method, or a laser processing, or a surface molded by a rough surface formed in advance in a transfer molding die.

4. The cooler-integrated semiconductor module according to claim 1, wherein a thickness of the joining member is 250 μm or less.

5. The cooler-integrated semiconductor module according to claim 1, wherein the joining member is a solder having a composition of 89% of Sn, 8% of Sb, and 3% of Ag.

6. The cooler-integrated semiconductor module according to claim 1, wherein the plating layer has a thickness of 1 μm or more and 5 μm or less, and includes at least one type of metal selected from the group consisting of copper, nickel, gold, and silver.

* * * * *

UNITED STATES PATENT AND TRADEMARK OFFICE
CERTIFICATE OF CORRECTION

PATENT NO. : 9,530,713 B2
APPLICATION NO. : 15/205723
DATED : December 27, 2016
INVENTOR(S) : Takafumi Yamada Page 1 of 1

It is certified that error appears in the above-identified patent and that said Letters Patent is hereby corrected as shown below:

In the Specification

Please change Column 3, Line 28, from "... as across sectional ..." to --... as a cross sectional ...--.

Signed and Sealed this
Second Day of May, 2017

Michelle K. Lee
*Director of the United States Patent and Trademark Office*